[19] United States Patent
Scannell et al.

[11] 3,992,772
[45] Nov. 23, 1976

[54] ASSEMBLY STATION FOR PRINTED CIRCUIT BOARDS

[75] Inventors: Robert M. Scannell, St. Charles, Mo.; Willard E. W. Krick, Millstadt, Ill.; Edward R. Windish, Ferguson, Mo.

[73] Assignee: McDonnell Douglas Corporation, St. Louis, Mo.

[22] Filed: Mar. 15, 1976

[21] Appl. No.: 667,204

[52] U.S. Cl. .............................. 29/626; 29/203 B; 29/407; 312/234; 340/282; 350/30; 356/166
[51] Int. Cl.² .......................................... H05K 3/30
[58] Field of Search ................. 29/407, 626, 203 B, 29/203 P, 625; 312/234, 234.1; 356/164, 165, 166, 168; 340/282, 380, 381; 350/30

[56] References Cited
UNITED STATES PATENTS

| 2,959,848 | 11/1960 | Savitt | 29/407 |
| 3,548,493 | 12/1970 | Hubbard | 29/626 |
| 3,621,554 | 11/1971 | Feldman et al. | 29/626 X |
| 3,667,104 | 6/1972 | Chamillard | 29/407 X |
| 3,710,477 | 1/1973 | Frawley | 29/203 B |
| 3,831,250 | 8/1974 | Holiday | 29/203 B |
| 3,852,865 | 12/1974 | Ragard | 29/203 B |

Primary Examiner—Victor A. DiPalma
Attorney, Agent, or Firm—Lionel L. Lucchesi

[57] ABSTRACT

A device and method for simplifying the placement of electronic components in printed circuit boards are provided, the apparatus including an illuminated work area for illuminating openings in a mask transported across the work area. A load roller and a take-up roller, along with associated guide rollers, are arranged on opposite ends of the work area. The continuous, programmed mask is arranged in individual frames. The mask is carried across the work area by the rollers, which are driven by suitable drive means. Each frame of the mask has a number of light passing openings or markings made in it, the openings, in turn, permitting the illumination of corresponding openings in at least one printed circuit board (PCB) mounted over the mask, the PCB requiring component part insertion. The mask also has position indications on it which are read to position the mask for each frame. Preferably, timing indications also are made on each frame which enables the device to advance both the mask and an associated parts supply means to the succeeding frame after termination of an idealized elapsed time period for the component placement required by the preceding frame. The parts supply means is coordinated for movement with each frame of the mask so that any part required for assembly in a particular frame of the mask is provided simultaneously with that frame. The supply means includes a pair of stacked support tables driven sequentially in conjunction with mask frame advance. Sequentially numbered part trays are inserted in correspondingly numbered sections of the support tables, which numbers also correspond to a particular frame of the mask. Individual part bins are presented to the device operator for each frame of the printed circuit board construction sequence presented on the mask. A method of printed circuit board construction includes provisions for arranging parts in storable trays as a complete job package, inserting the trays in a device sequentially, the sequence corresponding to a predetermined construction pattern, and presenting both the pattern and parts to an operator simultaneously to facilitate PCB construction.

17 Claims, 19 Drawing Figures

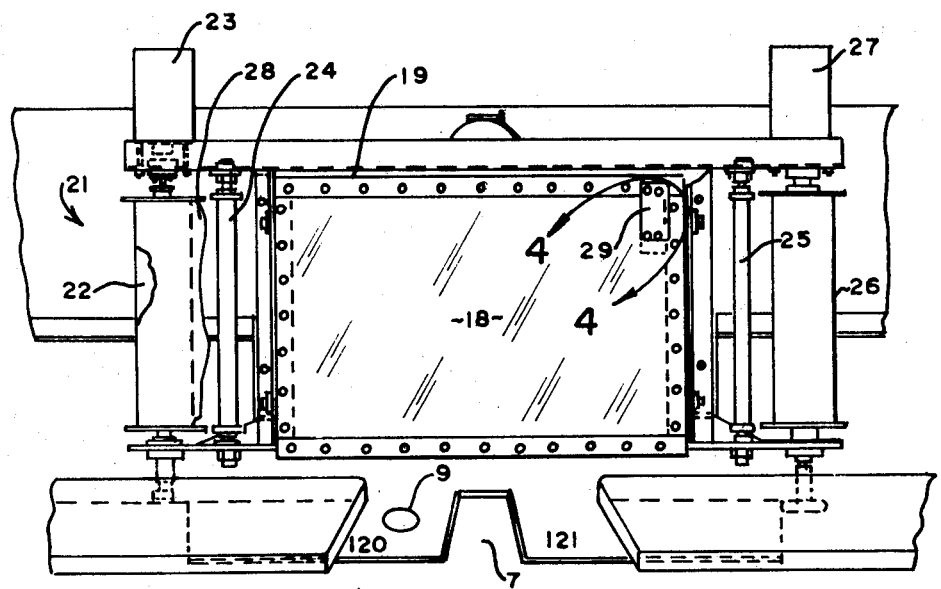
FIG. 3.
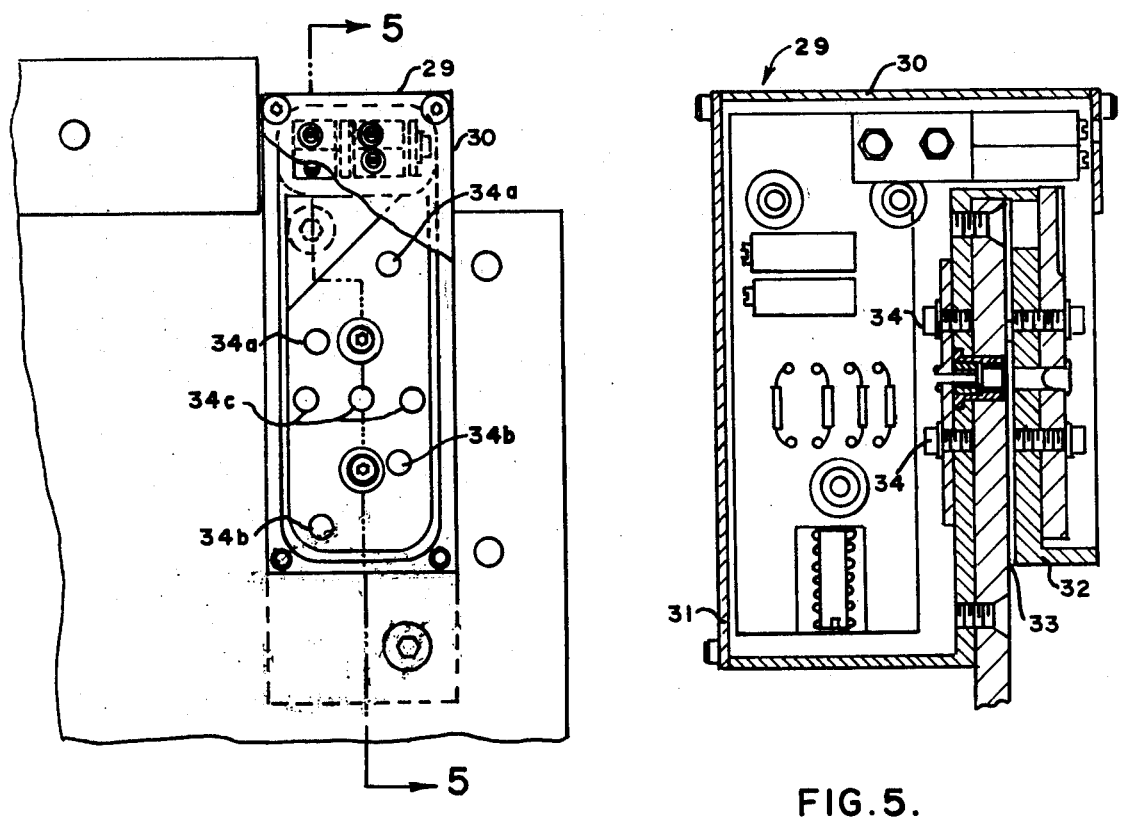
FIG. 4.
FIG. 5.

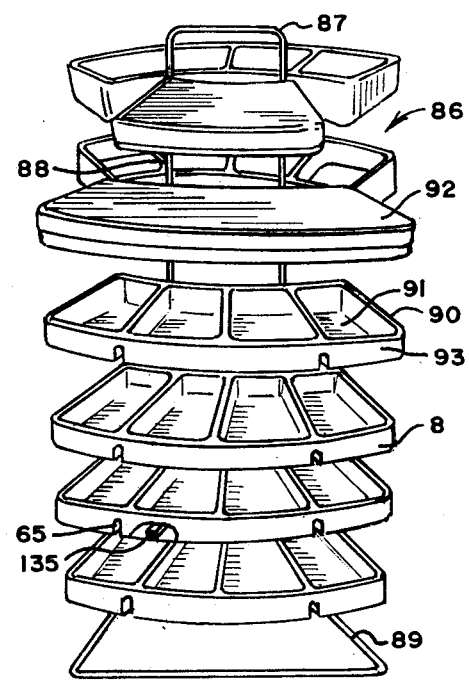
FIG. 12.
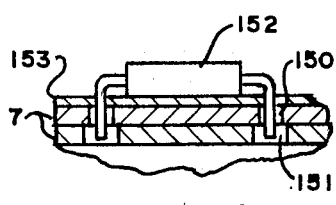
FIG. 18.
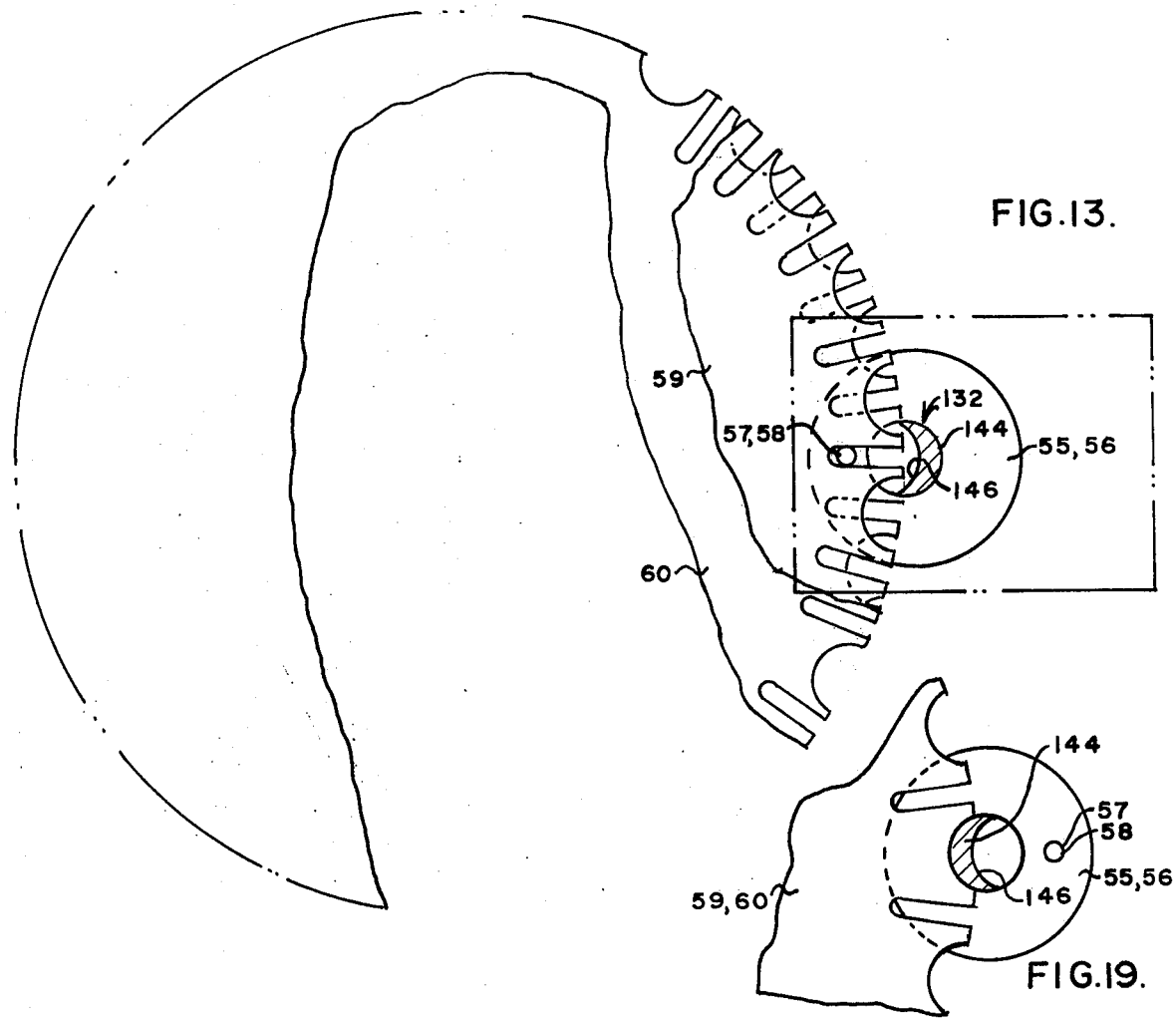
FIG. 13.
FIG. 19.

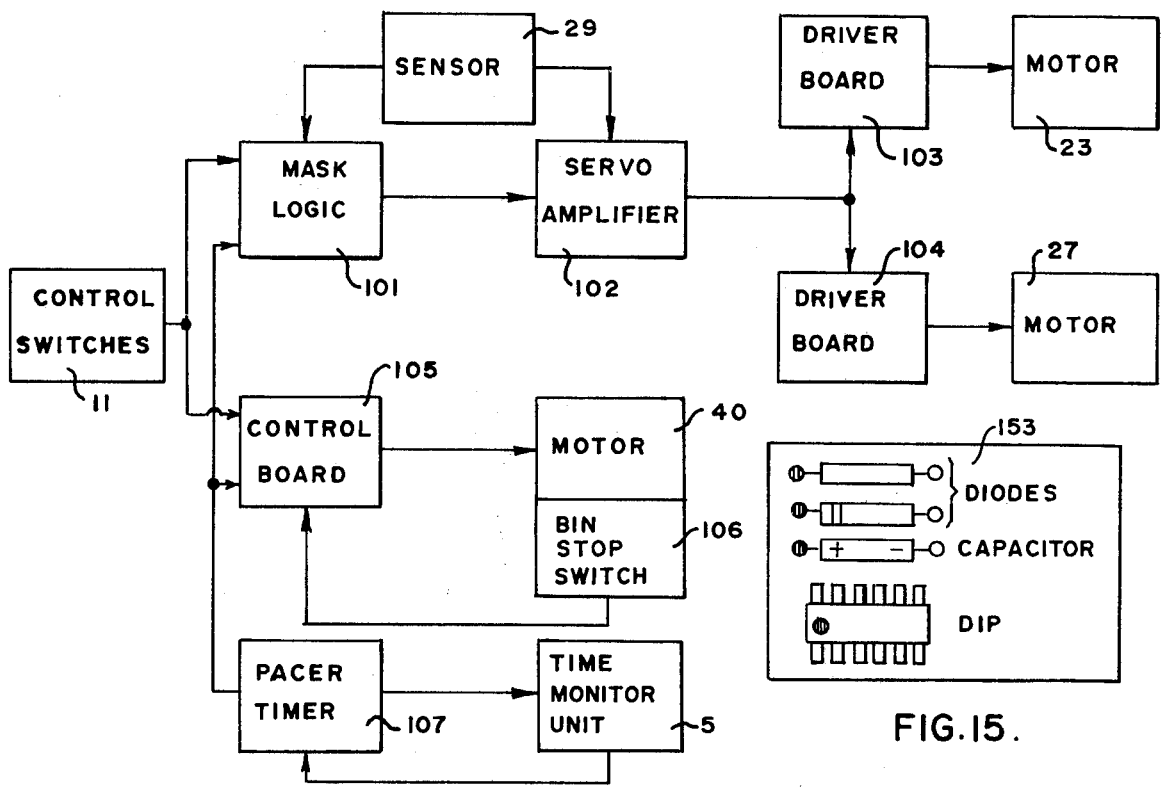
FIG. 14.
FIG. 15.
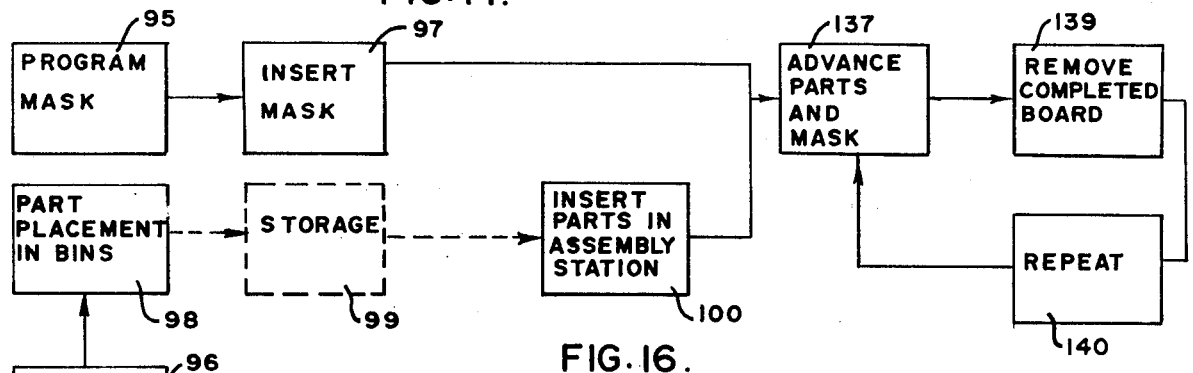
FIG. 16.
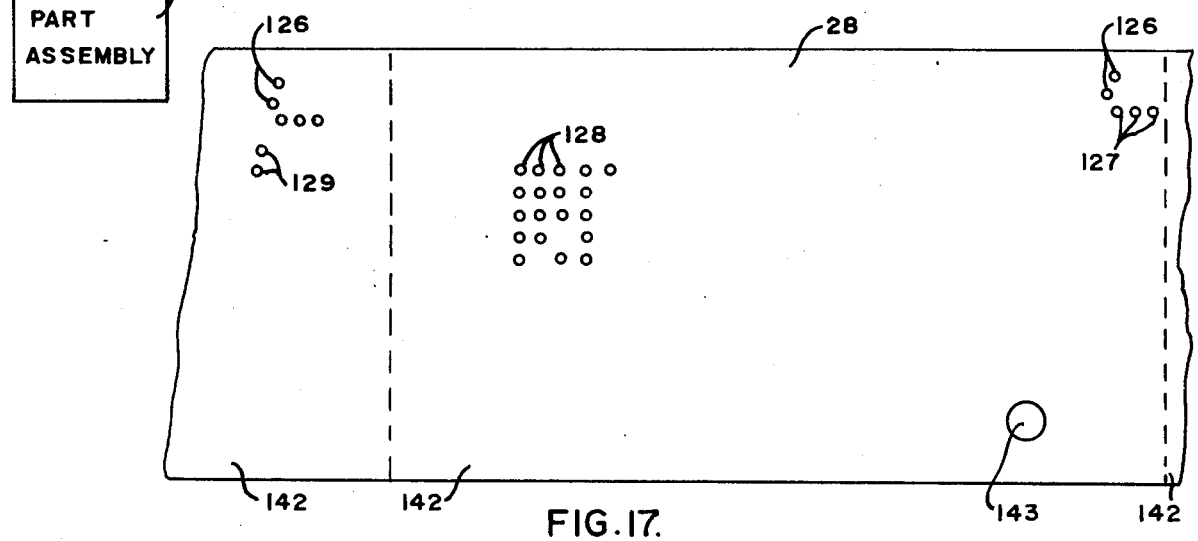
FIG. 17.

ASSEMBLY STATION FOR PRINTED CIRCUIT BOARDS

BACKGROUND OF THE INVENTION

This invention relates to an apparatus and method for setting electronic components into printed circuit boards (PCB), and in particular, is directed towards an assembly station which includes a pair of stacked support tables for holding the component parts used in the assembly of the boards, and an illuminated work area for shining light through a series of frames of a programmable mask which is sequentially transported across the work area in synchronization with the movement of the support tables.

As is well known, printed circuit boards usually are arranged to receive a variety of electronic components. Each individual circuit board is provided with perforations where the lead or terminal wires of various components are passed through from one side of the board to the other, the leads being connected to the circuit of the board on the latter side. Since the different types of components are closely spaced on the printed circuit board, the openings for the component lead wires are likewise closely spaced, and present a confusing array that makes it a difficult and slow process to set the components into the board with their lead wires extending through the proper perforations intended for them. In the past, great skill and knowledge on the part of the board assembler was required, which added substantial cost to the printed circuit board product.

A number of prior art devices are known which attempt to reduce the time and cost of printed circuit board assembly. For example, the U.S. patent to Chamillard et al, U.S. Pat. No. 3,667,104, issued June 6, 1972, discloses a printed circuit board assembly station which includes a rotary parts bin synchronously operated in conjunction with a plurality of selectably lightable lamps for sequentially back lighting different hole positions of a printed circuit board for disclosing the particular locations at which a particular bin component is to be mounted. Feldman et al, U.S. Pat. No. 3,621,554, issued Nov. 23, 1971, shows the use of a movable piano player roll-type mask having a plurality of openings in it, through which light is directed to corresponding holes of a circuit board for indicating the component insertion location positions. A similar device employing a fixed mask is disclosed in the U.S. patent to Howie, U.S. Pat. No. 3,372,455, issued Mar. 12, 1968. The U.S. patent to Savitt, U.S. Pat. No. 2,959,848, issued Nov. 15, 1960, also shows an optical assembling station including an apertured platform means which is backlighted through a mask to indicate color coded hole positions on a circuit board.

Rotary assemblies for delivering parts in conjunction with an indicated insertion sequence also are known in the art. The U.S. patents to Cronkite et al, U.S. Pat. No. 3,250,992, issued May 10, 1966; Hubbard, U.S. Pat. No. 3,548,493, issued Dec. 22, 1970; Leonhardt et al, U.S. Pat. No. 3,711,926, issued Jan. 23, 1973; Hall et al, U.S. Pat. No. 3,731,363, issued May 4, 1973; Ragard, U.S. Pat. No. 3,852,865, issued Dec. 10, 1974; and Ragard et al, U.S. Pat. No. 3,859,707, issued Jan. 14, 1975, all disclose rotary apparatus for presenting parts to an assembler.

Other art dealing with analogous subject matter includes the U.S. patents to Gray, U.S. Pat. No. 3,169,305, issued Feb. 16, 1965; Knoll et al, U.S. Pat. No. 3,564,692, issued Feb. 23, 1971; Sauve et al, U.S. Pat. No. 3,619,886, issued Nov. 16, 1971; Frels et al, U.S. Pat. No. 3,611,544, issued Oct. 12, 1971; Kowalski, U.S. Pat. No. 3,760,484, issued Sept. 25, 1973; Feldman, U.S. Pat. No. 3,815,204, issued June 11, 1974; and Holiday, U.S. Pat. No. 3,831,250, issued Aug. 27, 1974.

While these prior art apparatus work well for their intended purposes, their very number and diversity indicate that problems inherent in printed circuit board construction heretofore have not been resolved to the satisfaction of those involved in printed circuit board manufacture.

Our apparatus simplifies printed circuit board construction by permitting the coordination at a single station of a number of input functions, individual ones of which may be accomplished separately at a number of remote locations. Thus, a mask for use in the apparatus of this invention is programmed at an independent location by dividing the mask into a plurality of frames indicating the sequential insertion of electronic components within the corresponding printed circuit board. Each frame is numbered and includes position indicators on the mask for locating the particular frame with respect to the circuit board or boards under construction. The position indicators permit the mask to be used in conjunction with any assembly station of our invention. Alignment problems between the mask and circuit boards under construction inherent in prior art devices, are eliminated, as each frame automatically is located correctly by the position indicators, regardless of errors resulting from manufacturing tolerances between the programming station and the assembly station, or for errors arising because of differences in roll size and frame location on the roll. That is to say, automatic frame advancement is possible because frame location at the assembly station is a determination made autonomously of mask manufacturing considerations, although location markings are made during mask construction. Preferably, timing indicators also are made on the mask which enables the apparatus of our invention to advance the mask to the succeeding frame after the termination of a predetermined elapsed time period corresponding to the idealized time required for component insertion. Components required for insertion in the respective frames of the mask may be prepared remotely and placed in a plurality of part trays or bins which are arranged and stored according to frame sequence on the mask. The tray plurality may be sent directly to the assembly station or stored for later use. That is, all components required for a construction program set out on a particular mask may be arranged in a single storage and transporting package and correlated with the mask at the assembly station at a later time.

The apparatus or device disclosed herein includes an illuminated work area over which the mask is drawn. Means are provided for positioning each frame of the mask on the work area. A number of specific structural features are incorporated which enable the apparatus of our invention to coordinate frame and part presentation to the operator, and to time the operations required by each frame of the mask. Part presentation is accomplished through a unique arrangement of rotatable storage tables which receive the parts trays in sequential order. The parts trays are presented to the operator so that only the electrical component required for board insertion in a particular frame is available to the operator. Consequently, relatively fool-proof assembly results, in that single components and component location are presented to the operator simultaneously. The number of frames available for use with coordinated part presentation normally is sufficient to complete most printed circuit board constructions.

One of the objects of this invention is to provide an apparatus which simplifies assembly of printed circuit boards.

Another object of this invention is to provide an apparatus which coordinates part selection and part location during assembly of printed circuit boards.

Yet another object of this invention is to provide an apparatus with improved location capabilities for positioning a mask with respect to the printed circuit board under construction.

Another object of this invention is to provide an assembly apparatus utilizing a transferrable mask which incorporates a timing function indicating idealized time for component placement.

Still another object of this invention is to provide a simplified method for constructing a printed circuit board.

Other objects of this invention will be apparent to those skilled in the art in light of the following description and accompanying drawings.

SUMMARY OF THE INVENTION

In accordance with this invention, generally stated, a device and method for simplifying the construction of printed circuit boards are provided. The device includes a drive system for rotating a pair of roller drive motors which transport a programmable mask across an illuminated work area. The mask has position indicators marked on it, and the drive motors position the mask until a null is achieved at a sensor, the sensor being mounted to read the position indicators on the mask. The preferred embodiment also has timing indicators for each frame of the mask which are used to advance the succeeding frame upon the termination of some predetermined time period requirement for inserting the components of a particular frame in the locations indicated. A parts supply means is provided and moves with each frame of the mask so that a single parts bin is available to the operator of the apparatus with each frame of the mask. A method of printed circuit board construction permits part arrangement in storable trays on a complete job package basis, insertion of individual ones of the trays in a sequence corresponding to a predetermined constructional pattern, and the simultaneous presentation to an operator of both the component location and the component required for the constructional pattern.

BRIEF DESCRIPTION OF THE DRAWINGS

In the drawings.

FIG. 3 is a view in perspective, partly broken away, of the assembly station shown in FIG. 1, a housing shown in FIG. 1 being removed for explanation purposes;

FIG. 4 is an enlarged view taken about the area 4—4 of FIG. 3;

FIG. 5 is a sectional view taken along the line 5—5 of FIG. 4;

FIG. 12 is a view in perspective of a plurality of part bins utilized in conjunction with the apparatus of FIG. 1, shown in their stored configuration;

FIG. 13 is a top plan view, partly broken away, showing a gear means utilized in conjunction with the apparatus of this invention, the view being taken along the line 13—13 of FIG. 9;

FIG. 14 is a block diagrammatic view illustrating the operation of the assembly station shown in FIG. 1;

FIG. 15 is a diagrammatic illustration of a color code used for indicating polarity of various electrical components, the drawing being lined for the color red;

FIG. 16 is a block diagrammatic view illustrating a method for constructing a printed circuit board;

FIG. 17 is a diagrammatic illustration showing an illustrative example of various indicators on a programmed frame for a mask used in conjunction with the apparatus of FIG. 1;

FIG. 18 is an enlarged sectional view, partly broken away, taken along the line 18—18 of FIG. 2; and FIG. 19 is a view corresponding to FIG. 13, showing the gear means rotated 180°.

DESCRIPTION OF THE PREFERRED EMBODIMENT

Figure 1:
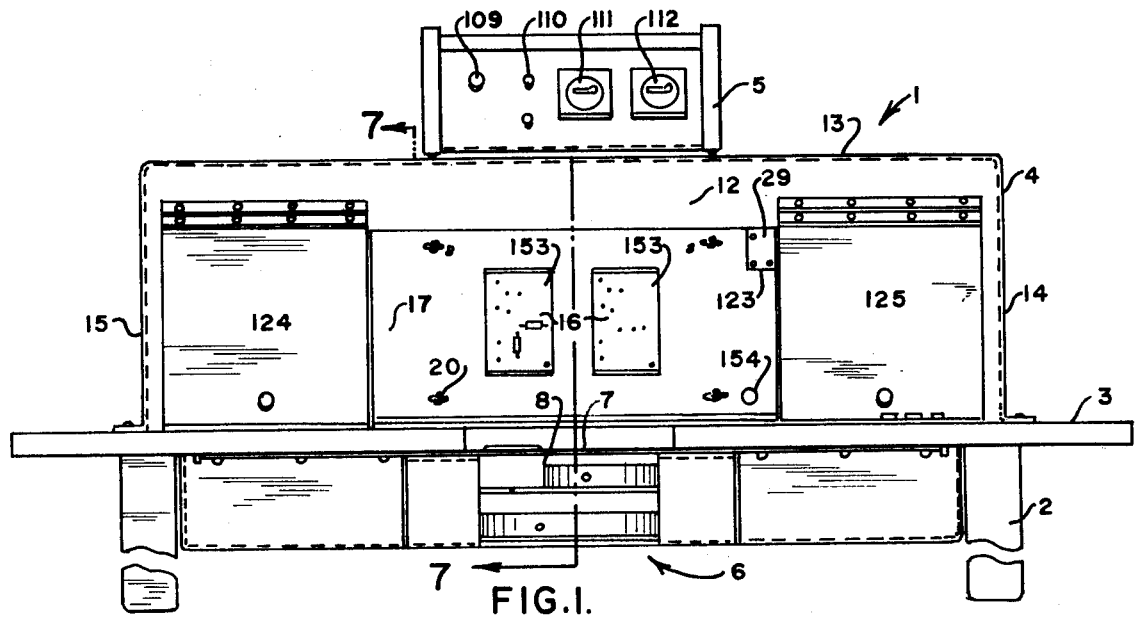
FIG. 1 is a view in front elevation, of one illustrative embodiment of assembly station of this invention.

Referring now to FIG. 1, reference numeral 1 indicates one illustrative embodiment of assembly station of this invention. The assembly station 1 includes a support structure 2, an upper platform 3, a housing 4 and a time monitor unit 5.

The support structure 2 and upper platform 3 are conventional and may comprise any of a variety of commonly available materials and design forms. The upper platform 3 resembles a conventional table top which is supported at its opposed ends by the support structure 2. Platform 3, however, does have a central operator's position 6 formed in it. The operator position 6 has a central opening 7 through it, the opening 7 being defined by a pair of spaced sides 120 and 121 of a platform 10 at the operator position 6. The opening 7 is sized to expose a single parts bin 8, illustrated in FIG. 12 and later described in greater detail. The side 120 of the platform 10 also has an opening 9 formed in it, which functions as a parts return opening for purposes later described in detail. In the particular embodiment illustrated, a plurality of control switches 11 are mounted in the platform 3, adjacent the position 6, which control various operations of the assembly station 1.

The housing 4 is defined by a slanted front face 12, an upper surface 13, a pair of oppositely opposed side walls 14 and 15, and a back 122.

The front face 12, in the embodiment illustrated, is slanted at a 45° angle, although the face slant is not a required feature of this invention. The face slant is, however, a human engineering feature which makes prolonged use of the assembly station 1 convenient for operating personnel. Face 12 includes a work area 16 having a length dimension L and a width dimension W. The work area 16 is covered by a tooling plate 17 which is mounted to a surface 18 of a light box 19, the light box being best seen in FIGS. 3 and 7.

The tooling plate 17 preferably is a pair of quarter-inch thick, drilled micarta or masonite plates, abutting one another so that their total thickness approximates one-half inch. Holes are drilled in the tooling plate 17 at locations corresponding to the printed circuit board under construction. The holes in the top one of the plate pair forming tooling plate 17, generally indicated by the numeral 150 in FIG. 18, have a smaller diameter than the corresponding holes, generally indicated by the numeral 151 in FIG. 18, in the bottom one of the plate pair. For example, the holes 150 in the top plate may have a diameter of 0.062 inch, while the corresponding holes 151 in the bottom one of the plates may have a diameter of 0.093 inch. This variation has at least two beneficial aspects. First, it aids the operator of the assembly station in placing a component 152 in a circuit board 153 under construction. Electrical components placed in printed circuit boards commonly have connection lead lengths of approximately one-half inch. The enlarged openings 151 in the bottom plate of the pair 17 ease lead reception. Secondly, it eases the task of programming a mask 28, the mask 28 being shown in FIGS. 3 and 17, a procedure later described herein.

The tooling plate 17 may be attached to the surface 18 of the light box 19 by any convenient method, conventional threaded fasteners, indicated generally by the numeral 20, may be utilized, if desired. Likewise, the printed circuit boards are attached to the plate 17 by any convenient method. The tooling plate 17 has a corner 123 cut away to permit the placement of a sensor 29 along the surface 18 of the light box 19.

Light box 19 is conventional, and generally is a rectangular structure having a plurality of fluorescent tubes or other light source, indicated generally by the numeral 141, mounted in it. The light source 141 directs light rays outwardly through the surface 18 of the light box 19 in a conventional manner.

A mask transport system 21 is mounted within the housing 4, along the closed ends of the light box 19. Access to various parts of the transport system 21 is made through a pair of hinged panels 124 and 125, respectively, attached to and forming a part of the housing 4 along opposed ends of the work area 16. The transport system 21 includes a rotatable feed roller 22 with an associated drive motor 23, and a rotatable guide roller 24 mounted on one side of the light box 19, and a corresponding rotatable guide roller 25, rotatable take-up roller 26 and drive motor 27 mounted on the opposite side of the light box 19, as is best observed in FIG. 3. Either or both of the rollers 22 and 26 may be removably mounted within the housing 4. In the embodiment illustrated, the roller 22 is so mounted. The removable mounting permits the insertion and removal of the mask 28.

The operation of the drive motors 23 and 27 are important in the positioning of the mask 28, as is described in greater detail hereinafter. It is sufficient here to note that the motors 23 and 27 tend to operate as a servo system, in that placement of mask 28 along the face 18 is varied by the operation of the motors 23 and 27 until proper positioning is achieved. The motors 23 and 27 themselves are conventional dynamoelectric machines including a rotor assembly rotatably mounted with respect to a stator assembly. The rotor assembly of each motor includes a motor shaft operatively connected to respective ones of the rollers 22 and 26. The positioning of the mask 28 also is a function of the guide rollers 24 and 25. That is, the guide rollers 24 and 25 are utilized to maintain the proper relationship between the mask 28 and the tooling plate 17 by maintaining the mask 28 in its proper tracking position across the face 18 of the light box 19.

As indicated above, the sensor 29 is mounted in the upper right-hand corner of the surface 18, as referenced to FIG. 3. The sensor 29 includes an enclosure 30 which is rectangular in plan, having a generally U-shape in cross section. The enclosure 30 has a first leg 31 and a second leg 32 defining a mask channel 33 therebetween, best seen in FIGS. 4 and 5. The sensor 29 has a plurality of photo cells 34 mounted in it, which are used in both the mask 28 positioning function and in the timing function provided by the assembly station 1. The photo cell plurality includes photo cells 34a for positioning the mask 28, photo cells 34b for determining termination of mask 28 travel and for instituting rewind of the mask, and photo cells 34c for programming the timing function of the assembly station 1. FIG. 5 illustrates various components of the electrical circuits utilized in conjunction with the photo cell 34 arrangement. The circuit designs are conventional, and are not described in detail. Those skilled in the art will recognize that a number of circuit variations may be derived to accomplish Applicants' result, once the functional aspects of the invention are understood.

As indicated, the mask 28 is drawn through the channel 33 so that the sensor 29 is able to read the position markings on the mask, and generate a signal for controlling the motors 23 and 27. The mask 28 preferably is constructed from an opaque material. A coated plastic material having a base formed from a film, available from the E. I. duPont de Nemours and Company under the trademark "Mylar," works well, for example. As is best observed in FIG. 17, the material is made translucent at predetermined locations to provide position indicators 126, timing indicators 127 and component location indicators 128. The total area of the mask is divided into a plurality of frames, indicated generally by the numeral 142. Each frame 142 has its own position indicator 126 for locating the mask 28, and the component location indicators 128 are made translucent at points corresponding to component location in the circuit board 153 under construction. Succeeding frames indicate additional component placement. The time indicators 127 also preferably are provided, although the timing function, as later explained, is an optional feature for the assembly station 1. The last frame of a particular mask 28 also is marked with reset indicators 129. The mask transport system 21 draws a frame of the mask 28 across the surface 18 of the light box 19 for each operational cycle. As indicated above, preferably each frame 142 is numbered, for example at 143, to indicate frame sequence to the operator of the assembly station 1, through a suitable opening 154 in the tooling plate 17.

Figure 6:
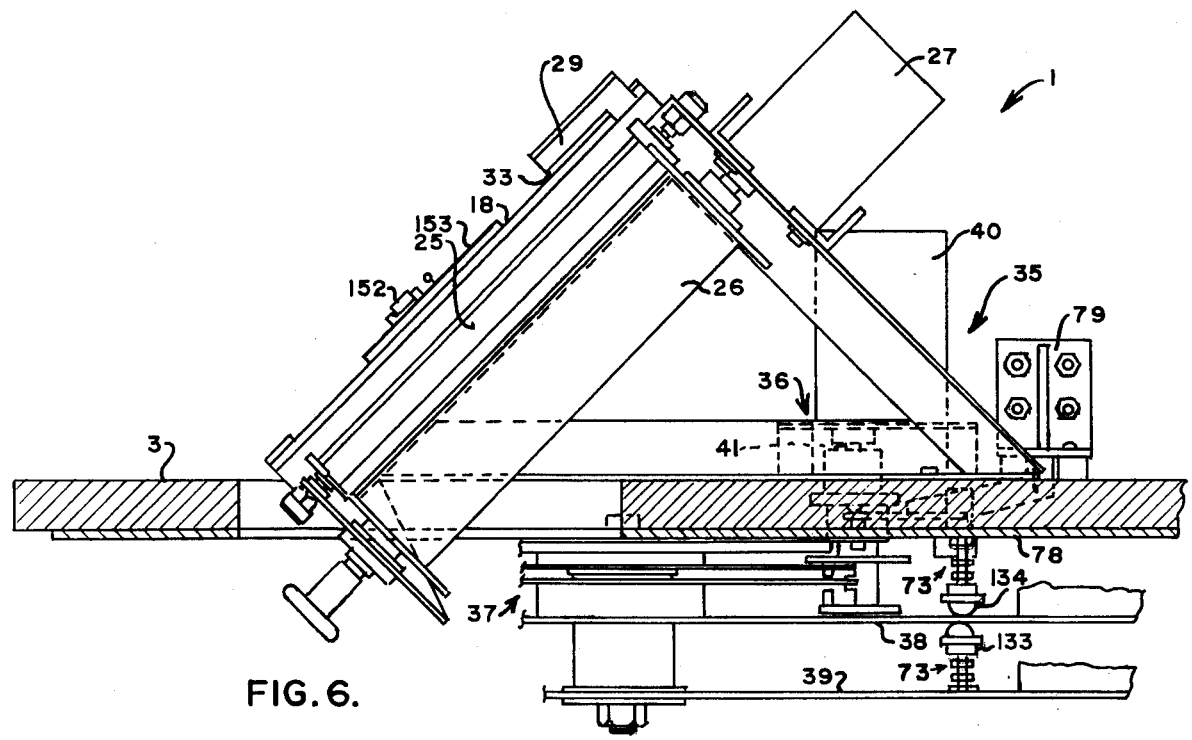
FIG. 6 is a view in side elevation, partly broken away, of the assembly station shown in FIG. 3.

Coordination of part delivery to the operator of the station 1 is accomplished by coordinating frame advancement of the mask transport system 21 with a parts drive system 35, indicated generally in FIG. 6. The parts drive system 35 includes a motor assembly 36, a rotary assembly 37 and a pair of support tables 38 and 39.

Figure 9:
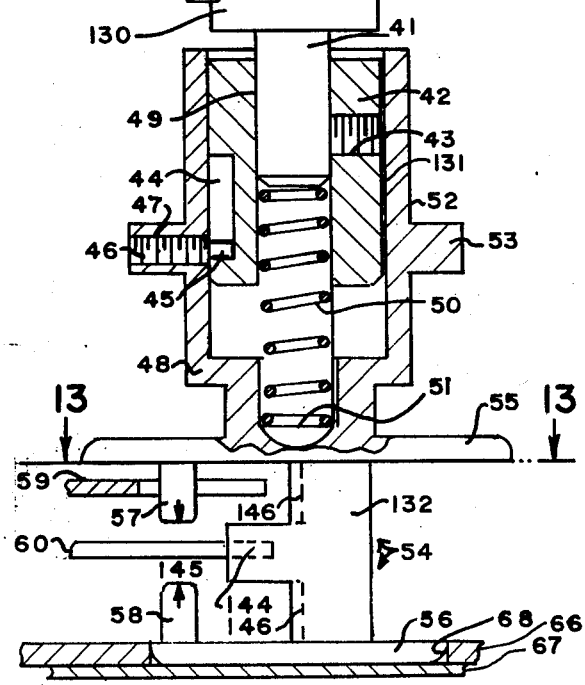
FIG. 9 is an enlarged view, partly in section and partly broken away, of the drive mechanism shown in FIG. 8.

A motor 40, forming a part of motor assembly 36, has a shaft 41 extending from one end of an enclosure 130. The shaft 41 has a collar 42 mounted to it, which is best shown in FIG. 9. The collar 42 generally is a tubular structure having an axial opening 49 extending through it, which receives the shaft 41 in a slip fit. The collar 42 has an outer wall 131 having a threaded radial opening 43 in it, the opening 43 communicating with the axial opening 49. The opening 43 receives a suitable fastener in a conventional manner to secure the collar 42 to the shaft 41. The wall 131 of the collar 42 also has an axial groove 44 formed in it, which receives an arm 45 of a set screw 46. The set screw 46 is inserted in a threaded opening 47 formed in a pinion 48. The arm 45 is free to move vertically, referenced to FIG. 9, within the groove 44, but is engaged by the collar 42 during rotation of the collar, so that the pinion 48 rotates with the shaft 41. The pinion 48 is slidably mounted on the collar 42, and a spring 50 is seated between an end of the shaft 41 and a spring seat 51 formed in the pinion 48. Spring 50 positions the pinion 48 in the downward position shown in FIG. 9, in the absence of other forces acting on the pinion.

Motor 40 is conventional and is not described in detail. As later described, rotation of the shaft 41 by the motor 40 provides drive for the support tables 38 and 39.

Pinion 48 has a cylindrical body portion 52 having an annular boss 53 integrally formed with and extending radially outwardly from it. As is observable in the drawings, the opening 47 may be and preferably is formed in the boss 53.

A lower portion 54 of the pinion 48 includes a body part 132 having a pair of support arm sections 55 and 56, respectively, integrally formed with and extending radially outwardly from the body part. Each of the arm sections 55 and 56 has a prong 57 and 58, respectively, extending axially outwardly from it, the prongs being axially aligned with and spaced from one another along a spacing 145, as is best seen in FIG. 9. The arm sections 55 and 56 generally are circular in plan, although other shapes may be used, if desired. The body part 132 has a cam means 144 integrally formed with it, which is located approximately midway between the spacing 145 between the prongs 57 and 58. Body part 132 also has a slot 146 formed in it which extends along the axial length of the body part 132.

A shaft 61 is attached to the platform 3 along a support plate 78. The shaft 61, in turn, has a pair of gears 59 and 60 rotatably mounted to it. The gears 59 and 60 are conventional geneva gears, and together with the corresponding prongs 57 and 58, each comprises a geneva drive arrangement. That arrangement is best understood with respect to FIGS. 13 and 19. The gears 59, 60 and the pinion 48 operate as a double geneva gear drive, one of the gears 59 and 60 being rotated by the prongs 57 and 58, respectively, depending upon the axial position of the pinion 48. The gear 59 and prong 57, in turn, are utilized to rotate the lower parts support table 39, while the gear 60 and prong 58 are used to rotate the upper support table 38 through suitable interconnections along the shaft 61. Rotational positions for the interconnections between the gears 59, 60 and the prongs 57, 58 are diagrammatically illustrated in FIGS. 13 and 19.

Figure 10:
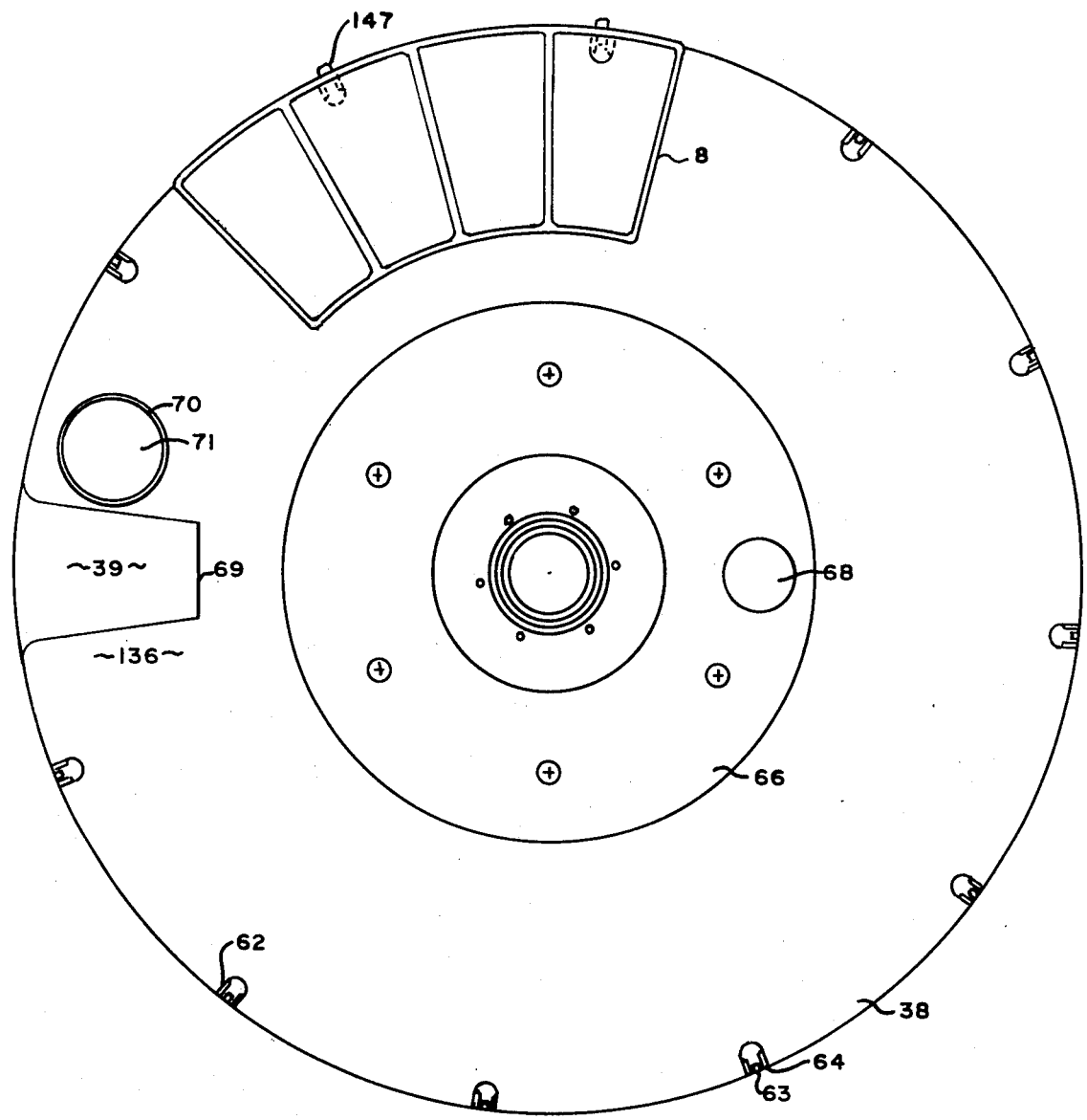
FIG. 10 is a top plan view, generally taken along the line 10—10 of FIG. 7, of one illustrative embodiment of a supporting table structure used in conjunction with the apparatus of this invention, certain structures being eliminated for drawing simplicity.
Figure 11:
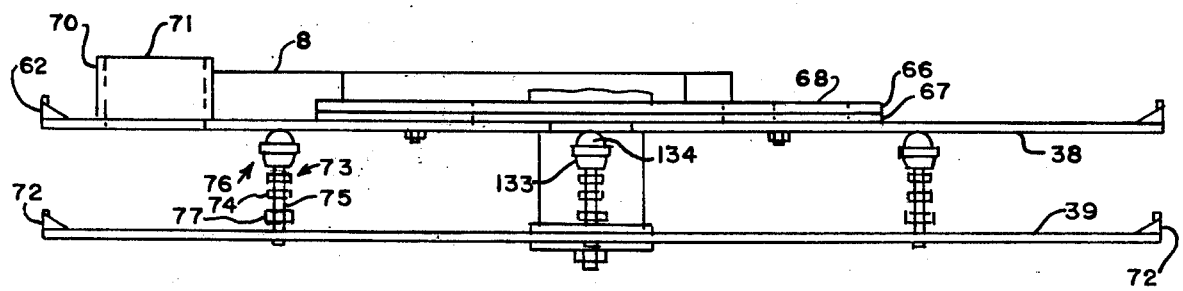
FIG. 11 is a view in side elevation of the supporting table structure shown in FIG. 10.

Support table 38, shown in FIG. 10, is a circular structure having a plurality of attachment means 62 located about its peripheral edge. Each of the attachment means includes a support member 64 having a suitable opening 63 in it, the opening 63 being sized to receive a fastener 147 in a conventional manner. The support members 64 are mounted to the table 38 by any convenient method. For example, rivets, spot welds or conventional fasteners work well. The attachment means 62 plurality are utilized to removably mount the part bins 8 to the support table 38, and one illustrative mounting position is illustrated in FIG. 10.

The support table 38 has a pair of shift rings 66 and 67 mounted to it in a conventional manner. Again, threaded fasteners between the respective components work well, for example. The shift rings 66 and 67 have an opening 68 formed in them, the opening 68 being sized to receive the arm support 56 in one position of the pinion 48, for purposes later described in detail. The peripheral edge of the table 38 also has a channel 69 formed in it, which extends radially inwardly from that edge. The channel 69 functions to permit access to the support table 39 in the operation of the assembly station 1. A parts chute 70 is mounted to the upper side of the support table 38 adjacent the access channel 69. Parts chute 70 is a tubular structure having an axial opening 71 through it. The opening 71 extends through the support table 38.

Support table 39 also is a circular member having a plurality of attachment means 72 mounted to it along the peripheral edge of the support table 39. Support table 39 is similar to the support table 38, except that the shift rings, parts chute and channel 69 are not included as table 39 features. Attachment means 72 also are similar to attachment means 62, and are not described in detail. The plate support table 39 has a plurality of bearing support means 73 attached to it. Each of the bearing support means 73 include a shaft 75 mounted in an opening in the support table 39. The shaft 75 has a roller bearing means 76 mounted to one end of it. A pair of threaded fasteners 74 and 77 are utilized to adjust the axial height of the bearing means 76 with respect to the support table 39. The bearing means 76 is conventional and includes a socket 133 having a roller bearing 134 mounted therein.

Figure 7:
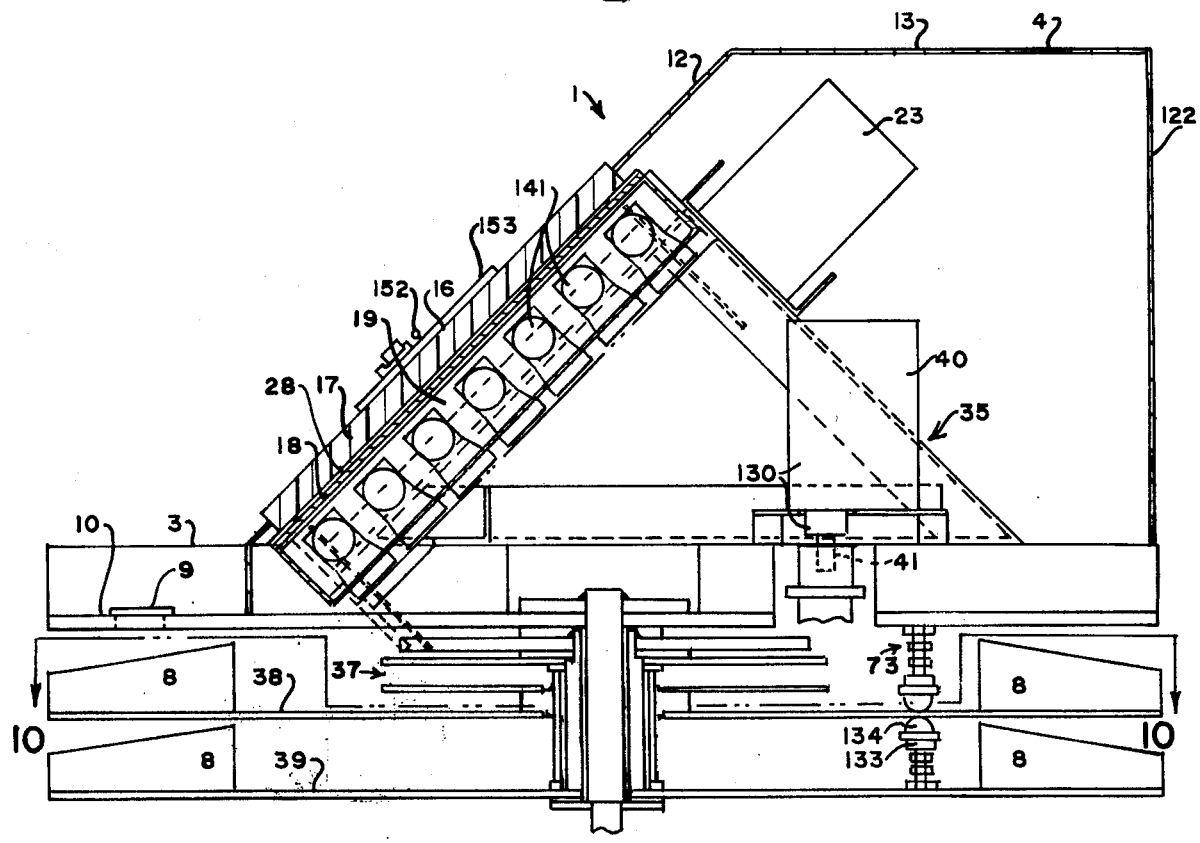
FIG. 7 is a sectional view taken along the line 7—7 of FIG. 1.
Figure 8:
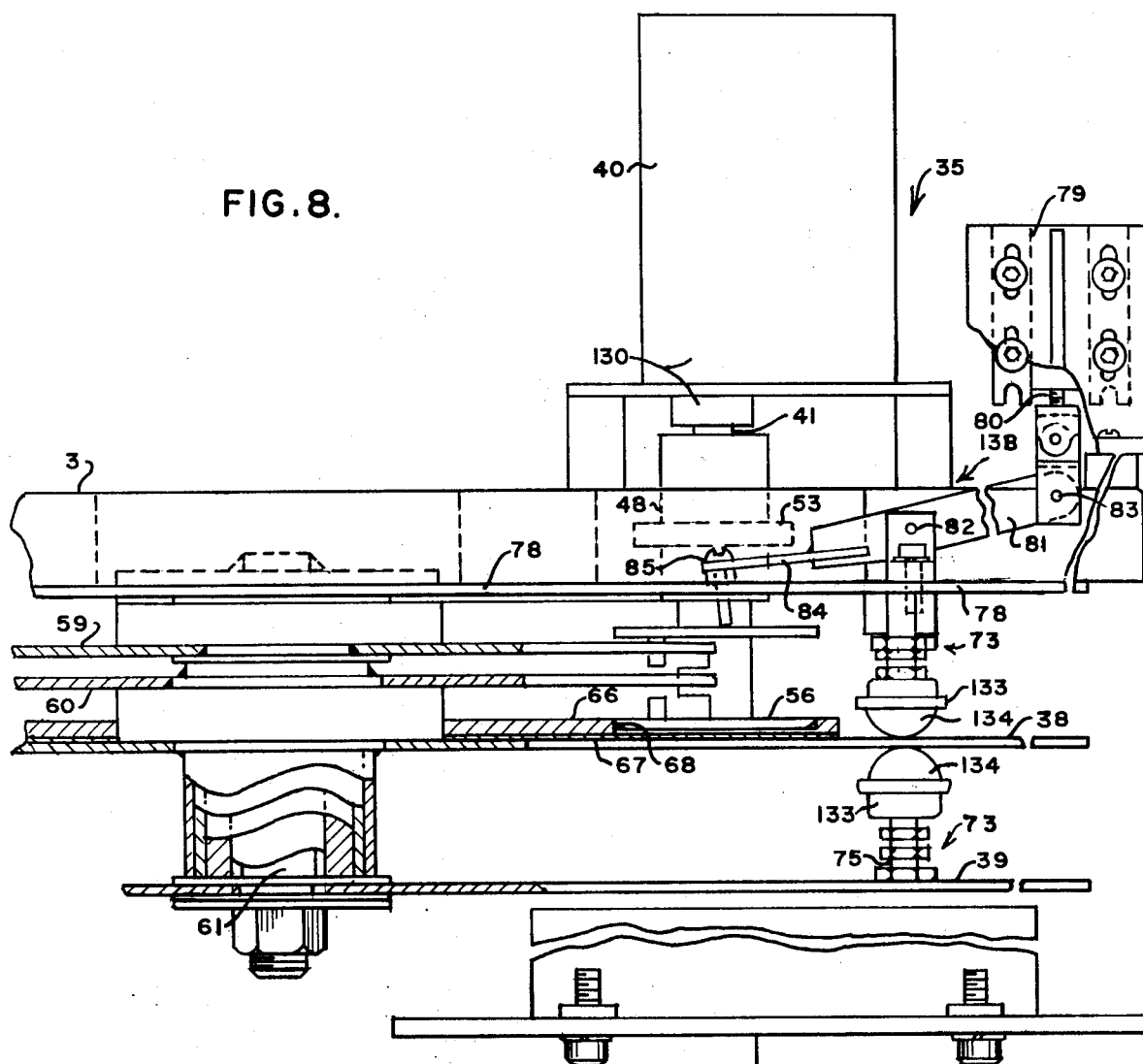
FIG. 8 is an enlarged view of the drive mechanism and supporting table plurality utilized in conjunction with the embodiment of FIG. 1.

As shown in FIGS. 6, 7 and 8, a corresponding plurality of roller bearing means 76 also are attached to the support plate 78, above the table 38, which abut the table 38 on the upper side thereof, while the roller bearing means 76 attached to the support table 39 abut the support table 38 on a lower side of the table 38. Consequently, the support tables 38 and 39 are stabilized with respect to one another and with respect to the platform 3.

It is thus apparent that a pair of stacked support tables 38 and 39 are provided which may be rotated independently of one another through the geneva gears 58 and 59, and that a structure for engaging and disengaging the geneva gearing is shown by the pinion 48 arrangement. Engagement and disengagement of respective ones of the gears 59 and 60 are accomplished through the use of a solenoid 79 and shifting mechanism 138, best observed in FIGS. 6, 7 and 8, as disclosed in conjunction with support table 38 and 39 operation.

The solenoid 79 includes a movable plunger 80 having one end attached to an arm 81. The arm 81 is pivotally mounted at 82 and 83 to permit vertical movement of an end 84 of the arm 81, vertical being referenced to FIG. 8. The end 84 of arm 81 is adapted to engage the boss 53 of the pinion 48. As shown in FIG. 8, the end 84 has an opening in it, which receives a conventional fastener 85, the fastener 85 being utilized as a bearing surface for engagement with the boss 53. Other forms of engagement between the solenoid 79 and pinion 48 are compatible with the broader aspects of our invention. As observable in FIG. 8, activation of the solenoid 79 draws the pinion 48 upwardly so that the prong 58 engages the gear 60. If the solenoid 79 is activated in conjunction with subsequent movement of the table 38, the arm 56 of the pinion 48 is lifted from the opening 68 in the table 38 and deposited on the shift ring 66. The solenoid then may be deactivated as the arm 56 will ride on the shift ring 66, which results in prong 58 intersection with the gear 60. As table 38 continues rotation, the arm 56 automatically will enter the opening 68 because of the bias provided by the spring 50, and rotation of the table 39 will commence.

As the term "geneva gearing" implies and FIGS. 3 and 19 illustrate, the structure utilized for the gears 59 and 60 functions so that a revolution of the motor 40 causes the particular gear to advance one position.

Referring now to FIG. 12, an assembly package 86 is illustrated, which includes a support carrier tree 87. The carrier tree 87 is formed from a central stand part 88 of skeleton construction. The stand part 88 has at least one leg 89 integrally formed with it, giving the carrier tree 87 free-standing capabilities. Carrier tree 87 also has a plurality of support sections 135 extending outwardly from the part 88, which are intended to receive and hold a plurality of the part bins 8.

In the embodiment illustrated, each of the part bins 8 comprise a partial circular segment 90 having a plurality of compartments 91 formed in it. The segments 90 are constructed from a suitable plastic material vacuum molded into the preferred shape shown. A peripheral edge 93 of the part bins 8 is constructed on a radius corresponding to the radius of the support tables 38 and 39, the radii of the support tables preferably being equal. A cover 92 may be provided to enclose each of the segments 90. The segments 90 are intended for reception in the device 1 at the tables 38 and 39. The edge 93 of the segments 90 is interconnected with the attachment means 62 and 72 of the respective support tables, positioning the segments 90 in the device 1. Preferably, each of the compartments 91 are numbered sequentially so that an operator of the assembly station 1 may insert the segments according to a pre-programmed plan, the loaded support tables resembling a conventional lazy susan design. A slot 65 is provided in the edge 93 to facilitate interconnection of the segments and attachment means.

Operation of the station 1 of this invention is relatively easy to understand. As shown in FIG. 16, the mask 28 is programmed in a step 95 so that a plurality of frames 142 will be presented along the surface 18 and the work area 16, each frame indicating the correct location of particular components 152 for interconnection with the printed circuit board 153. The programmed mask is sent to the station 1 where it is inserted on the roller 22 and drawn across the light box 19 to the roller 26. Placement of the mask in the station 1 is indicated by the step 97.

As indicated above, the electrical components 153 required for circuit board construction are assembled in a step 96, and are placed in the respective compartments 91 of the part bins 8 in a step 98. The respective parts are placed in the bins 8 in accordance with their use as required by the frame program of the mask 28. Thereafter, the package 86 may be stored in a step 99, or it may be used immediately in the station 1. Since storage is optional, the step 99 is shown in phantom lines in FIG. 20. The part bins 8 are placed along the support tables 38 and 39 in accordance with some predetermined order, so that each particular compartment 91 corresponds to a frame of the mask 28. Part bin 8 insertion in the station 1 is indicated by a step 100. The tables 38 and 39 have a total of 48 work positions available. The opening 69 and the chute 70 require two of the 48 positions, with the result that 46 discrete positions for parts may be presented to the operator at the central opening 7 in the station 1. In inserting the parts in the station 1, the upper support table 38 is loaded first, and loading continues until the opening 69 in the table 38 comes into alignment with the opening 7. The tables 38 and 39 rotate clockwise in the embodiment of FIG. 1 and the first loading position of the table 38 is adjacent the opening 69, being indicated generally by the numeral 136 in FIG. 10. When the opening 69 comes into alignment with the opening 7, the lower support table 39 is loaded with the bins 8, and the device is set for operation.

Station 1 operation is instituted by the operator through the use of the control switches 11 and is best understood with reference to FIG. 14. The selected operational command from the control switches 11 is sent to a mask logic control circuit 101 which determines the required direction of mask movement. A servo amplifier board 102 receives inputs from both the mask sensor 29 and mask logic circuit 101. Normally, the input from the mask logic circuit 101 will override the sensor 29 input, and the logic circuit 101 input is amplified by the servo amplifier board 102. The output of board 102 is an input to a driver control board 103 and a driver control board 104. The boards 103 and 104 control the motors 23 and 27, respectively. In both the forward and reverse directions of mask movement, the lead motor, that is, motor 23 in the forward direction and motor 27 in the reverse direction, always is driven slightly faster than the trail motor. This is done to maintain proper tension on the mask. When the sensor 29 senses the first frame 142 position indicator 126 as programmed on the mask 28, it sends a pulse to the mask logic board 101. The mask logic board, upon receipt of the sensor 29, input, removes its input from the servo amplifier board 102. The mask will continue to move due to sensor 29 input to the servo amplifier board 102 until a null is obtained between the position indicators 126 on the mask 28. When the null is sensed by the sensor 29, all inputs to the servo amplifier board 102 cease, and both of the motors 23 and 24 stop. Each frame of the mask is thus positioned exactly, and prior art difficulties with mask position are reduced or eliminated.

The control switches 11 also generate an input to a control circuit board 105 which determines the amount of travel of the support tables 38 and 39. The amount of travel either is to a reset position or to a single index movement for the motor 40. If a single index demand is given, the motor 40 will advance one of the tables 38 and 39 one position, and a micro switch stop 106 will reset the control circuit 105, stopping the drive motor 40. If a reset command is given by the operator of the device 1, the motor 40 will drive the support tables 38 and 39 to a home position before stopping. In the embodiment shown, the solenoid 79 and associated shifting mechanism 138 will energize only on the first indexing after the occurrence of a reset. However, other arrangements may be provided, if desired. As indicated, the shifting mechanism 138 shifts the motor 40 drive from the support table 39 to the support table 38. That is, at reset, the arm 56 is positioned within the opening 68. Upon the first indexing after reset, the solenoid 79 is energized so as to disengage the arm 56 from the opening 68. The upward stroke of the solenoid 79 also engages the gear 60 which enables the table 38 to rotate one position. Upon deactivation of the solenoid 79, the arm 56 will rest on the shift ring 66 until continued rotation of the table 38 permits the automatic engagement of the gear 59 by the pinion 48 occurring as a result of the entrance of arm 56 in the opening 68.

A pacer/timer means 107 along with the time monitor unit 5 may be provided, which automatically advances the system after a pre-selected time as programmed on the mask. If no advance has occurred prior to the expiration of the predetermined time period, a sound alarm and a visual signal will occur at the time monitor unit 5. After the occurrence of the alarm, the station 1 operator has approximately three seconds in which to decide to hold the particular position of the station 1 or to allow the advancement to the next frame of the mask. Various means for disabling the station 1 advancement may be provided. For example, depressing a foot switch, not shown, may be utilized to hold the station 1 in position until release. The time monitor unit 5 is intended to be used as an option to the station 1. That is, the station 1 may operate manually without the use of the unit 5. However, use of the time monitor unit 5 provides certain features not prevalent in the prior art.

Figure 2:
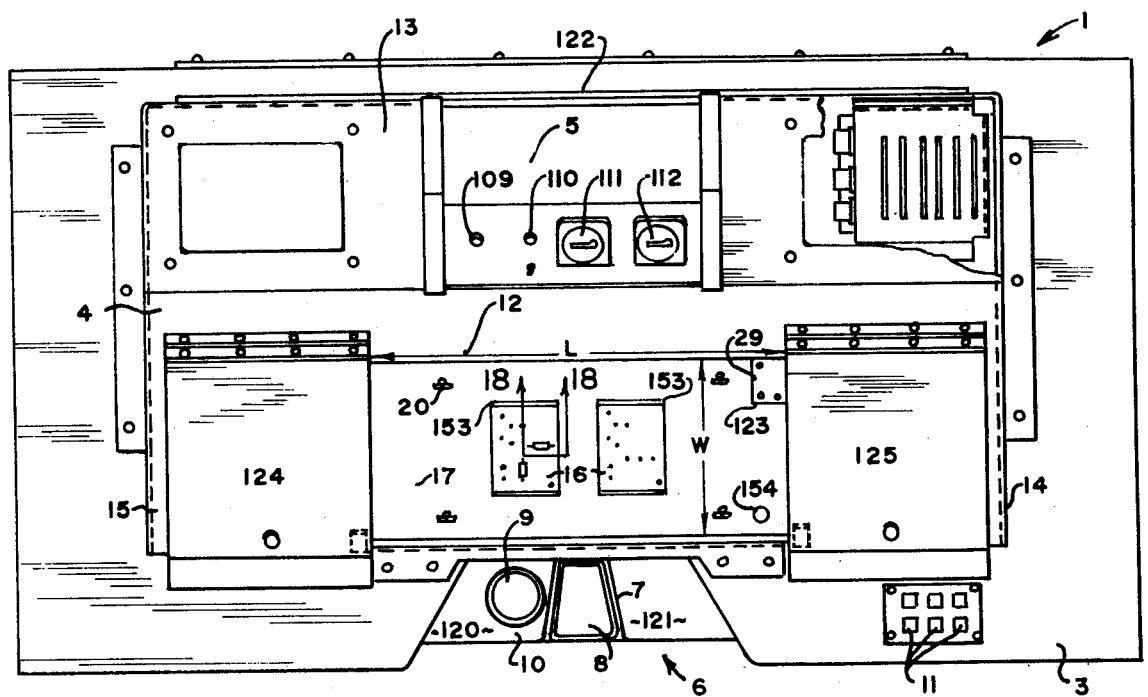
FIG. 2 is a top plan view of the assembly station shown in FIG. 1.

The time monitor unit 5 includes the alarm signal means 109 and the visual indicating means 110, along with a pair of conventional clocks 111 and 112, respectively, shown in FIGS. 1 and 2. In its automatic mode, that is, when the time monitor unit 5 is utilized, the clocks 111 and 112 give an indication of machine on time. These indications are very helpful when monitoring production output, and for adjusting that output when required.

The operation aspects just described are represented in FIG. 16, by the step 137. After completion of the particular circuit board under construction, it is removed from the tooling plate 17 in a step 139 and the appropriate control switch 11 is activated to reset the mask 28 and support tables 38 and 39, an operation represented by the step 140.

On most board assemblies, it will be necessary to show the polarity of the installed components. This is accomplished easily with our device by applying a color code to the positive side of the component opening indication on the mask 28. Red is a convenient color for this purpose. When used, the operator, in a particular frame, will see a red hole in the circuit board, the remainder of the holes of a particular frame being white. FIG. 15 illustrates such coding for a number of illustrative component 153 examples.

As indicated above, the tables 38 and 39 rotate clockwise. During assembly of a circuit board, the operator is able to take a handful of parts from the compartment 91 of the bins 8 present at the opening 7 and install them in all lighted holes in the board. As the last component is beingg installed, the operator either activates, or the machine itself through the timing indicators 127, activates the device so that the mask and parts supply move to the next sequence. Excess parts that the operator may have from the previous sequence merely are dropped into the opening 9 where they are returned to their proper compartment 91, and new parts are obtained from the compartment 91 then presented at the opening 7. Safety features may be incorporated to ensure that operators cannot catch parts of their body in the moving portions of the rotating support tables. For example, a photo-electric system that stops all action of the station 1 if an object breaks the light beam in the opening 7— compartment 91 areas may be incorporated in the station 1 design.

It is thus apparent that an assembly station is provided which simplifies PCB construction and meets all the ends and objects as hereinabove set forth.

Numerous variations, within the scope of the appended claims, will be apparent to those skilled in the art in light of the foregoing description and accompanying drawings. Thus, the design silhouette of various enclosures for components described may be varied. Likewise, while geneva gearing was described as the preferred drive means for the support tables 38 and 39, other gearing or other forms of drive means may be utilized, if desired. The number of support tables used in conjunction with the assembly station 1 may vary. We have found, however, that the two table arrangement described is suitable for most PCB construction requirements. As indicated, the automatic timing feature may be eliminated. Those skilled in the art will recognize that a number of features may be incorporated in other embodiments of this invention. For example, independent bin and mask movement, or various combinations of bin and mask movement, may be provided, if desired. While table 38 and 39 rotation was described as clockwise, counterclockwise rotation may be employed. The station 1 also may be utilized for harness assembly operations. In this latter situation, the tooling plate 17 actually becomes a harness board. The harness board has holes drilled along the path that wires are to be installed. Again, the mask 28 is programmed so that particular holes are illuminated, and parts for installation are again presented to the operator with each frame of the mask. Other materials for various components of the assembly station 1 may be substituted for those described. Thus, a paper mask having a plurality of holes punched in it may be used in place of the Mylar mask, if desired. In the embodiment illustrated, the time indicators 127 are used to set up timing circuits in the station 1 according to the following table:

| Time Code | Code | Time in Seconds |
| --- | --- | --- |
| 0 | --- | 10 |
|   | No holes |   |
| 1 | 0-- | 16 |
| 2 | -0- | 22 |
| 3 | 00- | 29 |

-continued

| Time Code | Code | Time in Seconds |
|---|---|---|
| 4 | --0 | 35 |
| 5 | 0-0 | 42 |
| 6 | -00 | 49 |
| 7 | 000 | 56 |

Other codes will occur to those skilled in the art. These variations are merely illustrative.

Having thus described the invention, what is claimed and desired to be secured by Letters Patent is:

1. An assembly station, which comprises:
   a support means;
   a translucent work area mounted to said support means;
   illuminating means beneath said work area, said illuminating means directing light rays towards said work area;
   a load roller rotatably mounted along a first end of said work area;
   a take-up roller rotatably mounted on a second end of said work area;
   guide roller means between each of said load and said take-up rollers and said work area, said guide roller means being aligned with said work area in a predetermined arrangement;
   first drive means for rotating said load roller;
   second drive means for rotating said take-up roller;
   means for controlling said first and said second roller drive means in response to the position of a mask disposed between said load and said take-up rollers;
   a programmed, continuous mask carried by and movable between said feed and said take-up rollers, said mask being arranged in a plurality of frames, said mask having position indicators for each frame marked on it;
   means for reading the mask position indicators operatively connected to said first and said second drive control means;
   a pair of stacked parts supply tables rotatably mounted to said support means, a first one of said table pair having an opening in it for permitting access to a second one of said table pair; and
   means for driving said tables sequentially as said mask moves from frame-to-frame across said work area.

2. The assembly station of claim 1 wherein said first support table has at least one shift ring mounted on it, said shift ring having an opening in it, said table drive means comprising a first gear operatively connected to said first supply table, a second gear operatively connected to said second supply table, and means for automatically engaging one of said first and said second gears, said engaging means including a pinion having first and second arms extending outwardly from it, said arms including means for engaging respective ones of said first and said second gears, one of said arms being sized for reception in the opening in said shift ring.

3. The assembly station of claim 2 further characterized by solenoid means for removing the arm of said pinion from the opening in said shift ring.

4. The assembly station of claim 2 wherein said mask is further characterized by time indicators on said mask, and means responsive to said time indicators for automatically advancing the mask of said assembly station to a subsequent frame upon termination of a predetermined elapsed time period.

5. The assembly station of claim 2 wherein said first supply table comprises a circular structure having a channel extending inwardly from its peripheral edge, and a sleeve mounted to said table in a position next to said channel, said sleeve and said table having an axial opening through it, and a plurality of attachment means mounted near the peripheral edge of said supply table.

6. The assembly station of claim 5 wherein said mask is further characterized by a plurality of translucent component position indicator locations, at least a portion of said translucent indicators being color coded to indicate component polarity.

7. An assembly station, which comprises:
   a support means, said support means defining an operator position, said operator position including an operator opening for making electrical components available to the operator;
   a housing mounted to said support area, said housing including a work area;
   illuminating means aligned with said work area, said illuminating means including a light source for directing light rays toward said work area;
   a load roller rotatably mounted on a first end of said illuminating means;
   a first guide roller mounted between said load roller and said illuminating means;
   a take-up roller rotatably mounted on a second end of said illuminating means;
   a second guide roller mounted between said take-up roller and said illuminating means;
   first drive means for rotating said load roller;
   second drive means for rotating said take-up roller;
   means for controlling said first and said second drive means;
   a programmed mask carried by and movable between said feed and said take-up rollers across said illuminating means, said mask being positioned between said illuminating means and said work area during transport of said mask across said work area, said mask having a generally opaque surface, predetermined lengths of said mask defining a frame for presentation at said work area, each of said frames having transparent indicators made in the opaque surface, said indicators including at least two position indicators;
   means for reading the position indicators of each frame of said mask, said reading means including means for generating an electrical signal operatively connected to said control means;
   a first part support table rotatably mounted to said support means;
   a second part support table rotatably mounted to said support means, said first and said second support tables being axially aligned but spaced from one another in a stacked relationship, said first support table having an opening in it which may be aligned with the opening in said support means for permitting access to said second support table;
   means for driving said first and second support tables; and
   means for shifting said roller drive means from said first support table to said second support table during movement of said mask across said illuminating means.

8. An assembly station, which comprises:

a support means, said support means defining an operator position at which electrical components are presented to an operator;

a housing mounted to said support means, said housing including a work area;

illuminating means aligned with said work area, said illuminating means including a light source for directing light rays toward said work area;

a load roller rotatably mounted on a first end of said illuminating means;

a take-up roller mounted on a second end of said illuminating means;

first drive means for rotating said load roller;

second drive means for rotating said take-up roller;

means for controlling said first and said second drive means;

a programmed mask carried by and movable between said feed and take-up rollers across said illuminating means, said mask being positioned between said illuminating means and said work area during transport of said mask across said work area, said mask having a generally opaque surface, lengths of said mask defining a frame for presentation at said work area, each of said frames having transparent indicators made in the opaque surface, said indicators including at least two position indicators;

means for reading the position indicators of each frame of said mask, said reading means including means for generating an electrical signal operatively connected to said control means;

a first part supply table rotatably mounted to said support means;

a second part support table rotatably mounted to said support means, said first and said second tables being axially aligned but spaced from one another, said first support table having an opening in it for permitting access to said second support table;

a plurality of part bins insertable and carried by said first and said second support tables; and means for driving said support tables sequentially as said mask moves from frame-to-frame.

9. An assembly station for constructing printed circuit boards including a support means, a light box containing a light source mounted to said support means, a pair of rollers, individual ones of said roller pair being rotatably mounted on opposed sides of said light box, means for driving said rollers, a programmable means carried on said rollers and movable across said light box, said programmable means being divided into frames for presentation at said light box, the improvement which comprises means for presenting electrical components to an operator of said assembly station in conjunction with frame presentation at said light box, said component presenting means comprising a first support table rotatably mounted to said support means, a second support table rotatably mounted to said support means, said first and said second support tables being axially aligned with respect to one another and with respect to said light box, means for rotating alternate ones of said first and said second support tables, means for shifting said rotating means between said first and said second support tables, and a plurality of part bins mounted to said first and said second support tables.

10. The improvement of claim 9 wherein said first support table includes at least one shift ring, said shift ring having an opening in it, said rotating means including a drive motor having a shaft, said shifting means including a pinion rotatable with said motor shaft, said pinion being movable between at least a first and a second position on said shaft, and means for biasing said pinion towards one of said first and said second positions, said pinion having a first end insertable in the opening of said shift ring, said first end entering the opening of said shift ring automatically during rotation of said first support table.

11. A method of constructing printed circuit boards, comprising:

programming a mask by presenting a plurality of frames along the mask, each frame having a plurality of indicators on it, said indicator plurality including at least two frame position indicators, and indicators for showing the order of part insertion for the printed circuit board;

inserting the mask in a device for sequentially presenting individual ones of the frames of said mask to an operator;

assembling a plurality of electrical components required for the printed circuit board construction;

packaging said plurality of electrical components in part bins having discrete compartments for each component type in accordance with the order of part insertion required by the mask programmed;

arranging the part bins from said packaging step as a unit for transport to said device;

inserting the part bins into said device, said device adapted to receive said part bins and to permit presentation of individual compartments of said part bins in sequence with individual ones of the frames of said mask;

advancing said mask and said part bins sequentially at said device; and inserting components from said part bins in the printed circuit board in accordance with the indicators on said mask.

12. The method of claim 11 wherein said arranging step includes the step of storing the part package prior to transport to said device.

13. An assembly station, which comprises:

a support means, said support means defining an operator position including an operator opening at which electrical components are presented to an operator;

a housing mounted to said support means, said housing including a work area;

illuminating means aligned with said work area, said illuminating means including a light source for directing light rays toward said work area;

a load roller rotatably mounted on a first end of said illuminating means;

a take-up roller mounted on a second end of said illuminating means;

first drive means for rotating said load roller;

second drive means for rotating said take-up roller;

means for controlling said first and said second drive means;

a programmed mask carried by and movable between said feed and take-up rollers across said illuminating means, said mask being positioned between said illuminating means and said work area during transport of said mask between said feed and take-up rollers, said mask having a generally opaque surface, lengths of said mask defining individual frames for presentation at said work area, each of said frames having light passing indicators made in the opaque surface, said indicators including at least two position indicators;

means for reading the position indicators of each frame of said mask, said reading means including means for generating an electrical signal operatively connected to said control means;

part supply means rotatably mounted to said support means, said part supply means including at least one support table and a plurality of discrete part bins removably mounted to said support table; and means for driving said support means as said mask moves from frame-to-frame.

14. The assembly station of claim 13 wherein said part supply means comprises a first support table and a second support table spaced from and aligned with respect to one another, said first support table having at least one shift ring mounted on it, said shift ring having an opening in it, said support driving means comprising a first gear operatively connected to said first supply table, a second gear operatively connected to said second supply table, and means for automatically engaging one of said first and said second gears, said engaging means including a pinion having first and second arms extending outwardly from it, said arms including means for engaging respective ones of said first and said second gears, one of said arms being sized for reception in the opening in said shift ring.

15. The assembly station of claim 14 further characterized by solenoid means for removing the arm of said pinion from the opening in said shift ring.

16. The assembly station of claim 13 wherein said readng means comprises at least two photo cells, said photo cells receiving light from said illuminating means through the position indicators of said mask, the electrical output of said photo cells being balanced when said mask is positioned correctly.

17. The assembly station of claim 16 wherein said mask has time indicators positioned on it, said reading means including a plurality of photo cells positioned to receive light from said illuminating means through the time indicators on said mask, the electrical output of said time indicator photo cells being utilized to advance said mask and said part supply means.

* * * * *

UNITED STATES PATENT AND TRADEMARK OFFICE
CERTIFICATE OF CORRECTION

PATENT NO. : 3,992,772
DATED : November 23, 1976
INVENTOR(S) : Robert M. Scannell et al It is certified that error appears in the above-identified patent and that said Letters Patent are hereby corrected as shown below:

Claim 13, Column 16, line 43, delete "including an operator opening".

Claim 13, Column 17, line 10, delete "removably".

Signed and Sealed this

Eighth Day of March 1977

[SEAL]

Attest:

RUTH C. MASON
Attesting Officer

C. MARSHALL DANN
Commissioner of Patents and Trademarks